(12) United States Patent
Jung et al.

(10) Patent No.: US 12,563,948 B2
(45) Date of Patent: Feb. 24, 2026

(54) DISPLAY PANEL

(71) Applicant: Samsung Display Co., Ltd., Yongin-Si (KR)

(72) Inventors: Jaehoon Jung, Yongin-si (KR); Jongchan Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 428 days.

(21) Appl. No.: 18/219,709

(22) Filed: Jul. 10, 2023

(65) Prior Publication Data

US 2024/0164184 A1 May 16, 2024

(30) Foreign Application Priority Data

Nov. 11, 2022 (KR) ........................ 10-2022-0150988

(51) Int. Cl.
 *H10K 59/80* (2023.01)
 *H10K 59/122* (2023.01)
(52) U.S. Cl.
 CPC ......... *H10K 59/873* (2023.02); *H10K 59/122* (2023.02)
(58) Field of Classification Search
 CPC ........................... H10K 59/873; H10K 59/122
 See application file for complete search history.

(56) References Cited

U.S. PATENT DOCUMENTS 10,454,063 B2 10/2019 Chang et al.
2020/0052054 A1* 2/2020 Park ................... H10K 59/1213

| | | | |
|---|---|---|---|
| 2021/0375948 A1* | 12/2021 | Ye | H10D 86/0212 |
| 2022/0085121 A1 | 3/2022 | Kim et al. | |
| 2022/0102668 A1 | 3/2022 | Wang et al. | |
| 2022/0149321 A1 | 5/2022 | Jeon et al. | |
| 2022/0149323 A1 | 5/2022 | Kim et al. | |
| 2022/0271255 A1 | 8/2022 | Choi et al. | |
| 2022/0320199 A1 | 10/2022 | Lee et al. | |
| 2022/0399524 A1* | 12/2022 | Jia | H10K 59/124 |

FOREIGN PATENT DOCUMENTS

| | | | | |
|---|---|---|---|---|
| CN | 112164760 A | * | 1/2021 | H10K 59/873 |
| CN | 113835256 A | | 12/2021 | |
| KR | 10-2016-0081106 A | | 7/2016 | |
| KR | 10-2021-0149019 A | | 12/2021 | |
| KR | 10-2022-0034949 A | | 3/2022 | |
| KR | 10-2022-0063790 A | | 5/2022 | |
| KR | 10-2022-0120793 A | | 8/2022 | |

* cited by examiner

*Primary Examiner* — Mariceli Santiago
(74) *Attorney, Agent, or Firm* — Innovation Counsel LLP

(57) ABSTRACT

Provided is a display panel comprising a substrate including an opening area, a display area surrounding at least a portion of the opening area, and a middle area disposed between the opening area and the display area, and having a first width in a first direction and a second width in a second direction intersecting with the first direction, wherein the first width is equal to or less than the second width, a first blocking wall arranged in the middle area to surround the opening area and including a first upper surface, a second blocking wall arranged in the middle area to surround the first blocking wall and including a second upper surface, and a first connection wall arranged between the first blocking wall and the second blocking wall and connecting the first blocking wall and the second blocking wall to each other.

20 Claims, 15 Drawing Sheets

PAD

DISPLAY PANEL

CROSS-REFERENCE TO RELATED APPLICATION

This application is based on and claims priority under 35 U.S.C. § 119 to Korean Patent Application No. 10-2022-0150988, filed on Nov. 11, 2022, in the Korean Intellectual Property Office, the disclosure of which is incorporated by reference herein in its entirety.

BACKGROUND

1. Field

The present disclosure generally relates to a display panel, and more particularly, to a display panel which is robust against stress caused by a tensile force generated when the display panel is adhered to a cover window.

2. Description of the Related Art

A display apparatus is an apparatus that receives information about an image and displays the image. A display panel of a display apparatus may be adhered to a cover window by using an adhesive film or the like.

During an adhering process of a display panel, a tensile force may be applied to the display panel in left and right directions thereof. The display panel may be damaged due to stress caused by the tensile force applied in the left and right directions.

SUMMARY

One or more embodiments include a display panel which is robust against stress due to a tensile force generated when the display panel is adhered to a cover window. However, these problems are examples, and the scope of the present disclosure is not limited thereto.

Additional aspects will be set forth in part in the description which follows and, in part, will be apparent from the description, or may be learned by practice of the presented embodiments of the disclosure.

According to one or more embodiments, a display panel includes a substrate including an opening area, a display area surrounding at least a portion of the opening area, and a middle area between the opening area and the display area, and having a first width in a first direction and a second width in a second direction intersecting with the first direction, wherein the first width is equal to or less than the second width, a first blocking wall arranged in the middle area to surround the opening area and including a first upper surface, a second blocking wall arranged in the middle area to surround the first blocking wall and including a second upper surface, and a first connection wall arranged between the first blocking wall and the second blocking wall and connecting the first blocking wall and the second blocking wall to each other.

The display panel may further include a second connection wall arranged between the first blocking wall and the second blocking wall, connecting the first blocking wall and the second blocking wall to each other, and spaced apart from the first connection wall.

The first connection wall and the second connection wall may be disposed on a virtual straight line passing through a center of the opening area.

The virtual straight line may be parallel to the second direction.

The first upper surface, the second upper surface, and an upper surface of the first connection wall may form a continuous surface.

The first upper surface, the second upper surface, and an upper surface of the second connection wall may form a continuous surface.

A first distance from an upper surface of the substrate to the first upper surface, a second distance from the upper surface of the substrate to the second upper surface, and a third distance from the upper surface of the substrate to an upper surface of the first connection wall may be equal to each other.

A first distance from an upper surface of the substrate to the first upper surface, a second distance from the upper surface of the substrate to the second upper surface, a third distance from the upper surface of the substrate to an upper surface of the first connection wall, and a fourth distance between the upper surface of the substrate to an upper surface of the second connection wall may be equal to each other.

The opening area may be disposed at a center of the substrate in the first direction.

The first blocking wall may have a same layer structure as the second blocking wall and include a same material as the second blocking wall.

The first blocking wall, the second blocking wall, and the first connection wall may form an integral body.

The first blocking wall, the second blocking wall, and the second connection wall may form an integral body.

The display panel may further include an inorganic insulating layer disposed on the substrate, a first organic insulating layer disposed on the inorganic insulating layer, and a pixel defining layer disposed on the first organic insulating layer.

At least one of the first blocking wall and the second blocking wall may have a same layer structure as the first organic insulating layer and the pixel defining layer, and include a same material as the first organic insulating layer and the pixel defining layer.

At least one of the first blocking wall and the second blocking wall may include a first sub-blocking wall having a same layer structure as the first organic insulating layer and including a same material as the first organic insulating layer, and a second sub-blocking wall disposed on the first sub-blocking wall, having a same layer structure as the pixel defining layer, and including a same material as the pixel defining layer.

According to one or more embodiments, a display panel includes a substrate including an opening area, a display area surrounding at least a portion of the opening area, and a middle area between the opening area and the display area, and having a first width in a first direction and a second width in a second direction intersecting with the first direction, wherein the first width is equal to or less than the second width, an inorganic insulating layer disposed on the substrate, and a blocking wall disposed on the inorganic insulating layer, arranged in the middle area to surround the opening area, and including a first opening and a second opening when viewed from a direction perpendicular to the substrate, wherein the first opening exposes a portion of the inorganic insulating layer, and the second opening exposes another portion of the inorganic insulating layer and is positioned to be symmetrical with the first opening with respect to a center of the opening area.

The first opening and the second opening may be disposed on a virtual straight line passing through the center of the opening area.

The virtual straight line may be parallel to the first direction.

The display panel may further include an inorganic insulating layer disposed on the substrate, a first organic insulating layer disposed on the inorganic insulating layer, and a pixel defining layer disposed on the first organic insulating layer.

The blocking wall may include a first sub-blocking wall having a same layer structure as the first organic insulating layer and including a same material as the first organic insulating layer, and a second sub-blocking wall disposed on the first sub-blocking wall, having a same layer structure as the pixel defining layer, and including a same material as the pixel defining layer.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 7 is a schematic cross-sectional view of an example of the display panel of FIG. 6, taken along line B-B';

FIG. 9 is a schematic cross-sectional view of an example of the display panel of FIG. 6, taken along line B-B';

DETAILED DESCRIPTION

Figure 1:
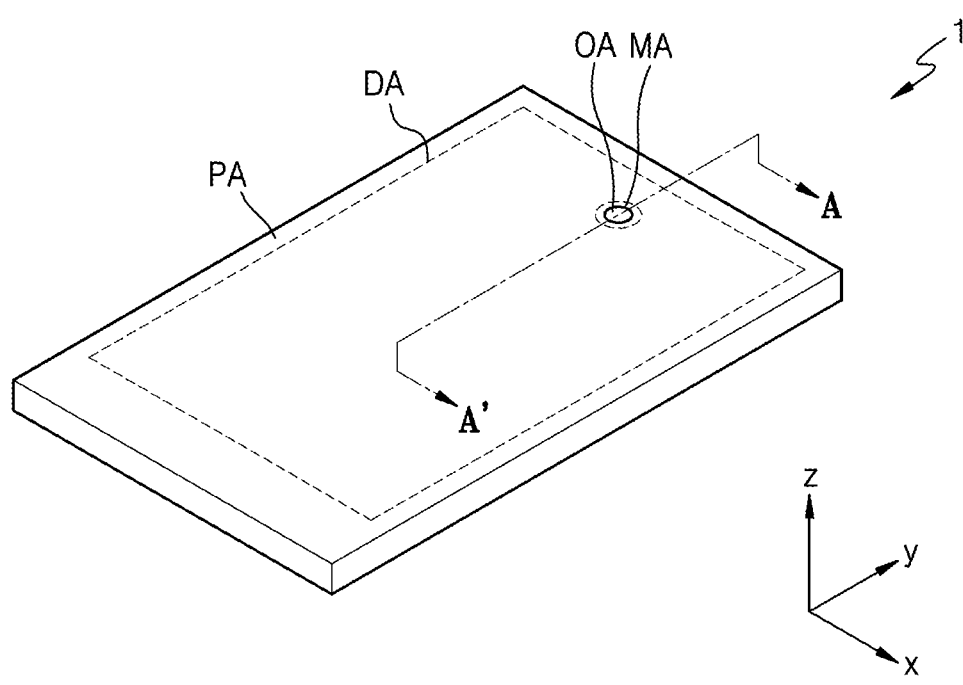
FIG. 1 is a schematic perspective view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, particular embodiments will be illustrated in the drawings and described in detail in the written description. Effects and features of the disclosure and methods of achieving the same will be apparent with reference to embodiments and drawings described below in detail. The disclosure may, however, be embodied in many different forms and should not be construed as being limited to the embodiments set forth herein.

The disclosure will now be described more fully with reference to the accompanying drawings, in which embodiments of the disclosure are shown. Like reference numerals in the drawings denote like elements, and thus their description will be omitted.

It will be understood that when a layer, region, or component is referred to as being "formed on" another layer, region, or component, it can be directly or indirectly formed on the other layer, region, or component, for example, intervening layers, regions, or components may be present. Sizes of components in the drawings may be exaggerated for convenience of explanation. In other words, since sizes and thicknesses of components in the drawings are arbitrarily illustrated for convenience of explanation, the following embodiments are not limited thereto.

The x, y, and z axes are not limited to three axes on the orthogonal coordinates system, and may be interpreted in a broad sense including the same. For example, the x, y, and z axes may be perpendicular to one another, or may represent different directions that are not perpendicular to one another.

Hereinafter, a display panel according to an embodiment is described in detail.

FIG. 1 is a schematic perspective view of a display apparatus 1 according to an embodiment.

Figure 2:
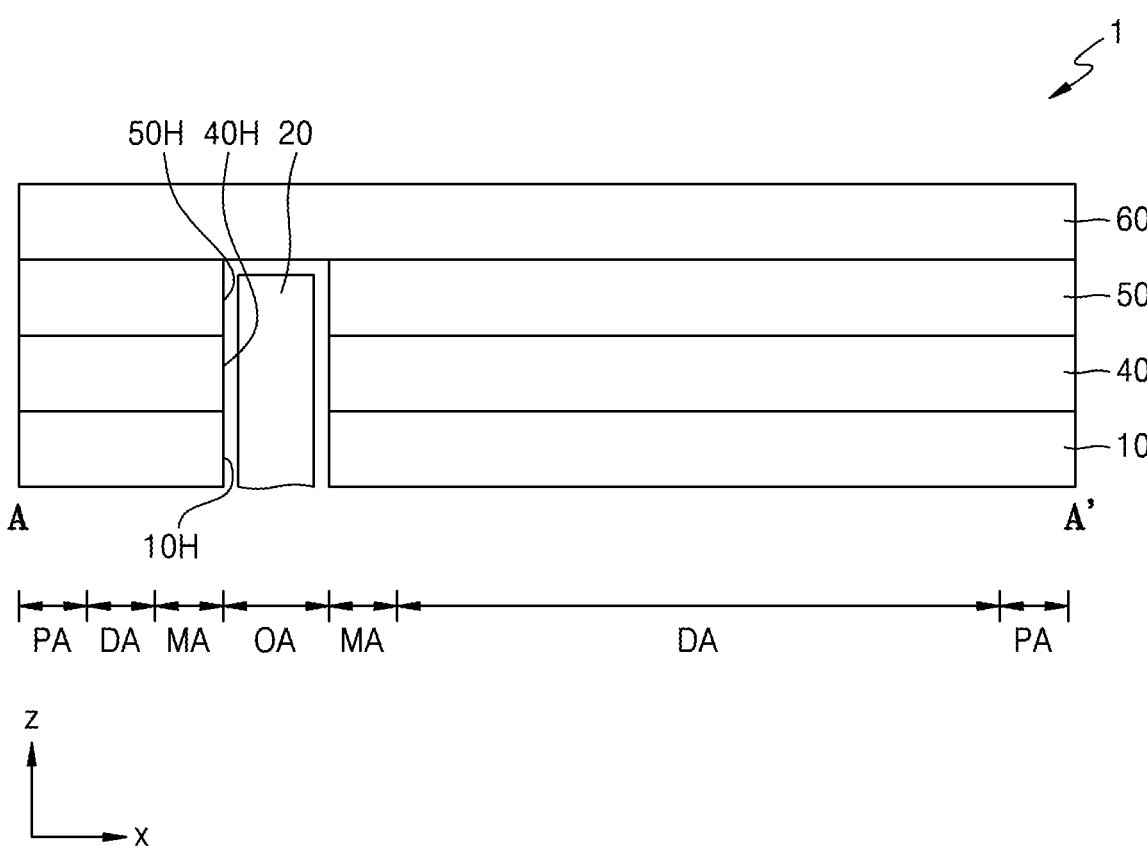
FIG. 2 is a schematic cross-sectional view of the display apparatus of FIG. 1, taken along line A-A'.

As shown in FIG. 1, the display apparatus 1 includes an opening area OA (or a transmission area, a first area) and a display area DA at least partially surrounding the opening area OA. The display apparatus 1 may provide certain images by using light emitted from a plurality of pixels arranged in the display area DA. The opening area OA may be partially or entirely surrounded by the display area DA. The opening area OA may be an area where a component to be described below with reference to FIG. 2 is arranged.

A middle area MA may be between the opening area OA and the display area DA, and the display area DA may be surrounded by a peripheral area PA. The middle area MA and the peripheral area PA may be a type of non-display area in which pixels area not arranged. The middle area MA may be partially or entirely surrounded by the display area DA, and the display area DA may be entirely surrounded by the peripheral area PA.

Hereinafter, the display apparatus 1 according to an embodiment is described as an organic light-emitting display apparatus as an example, but the display apparatus of the disclosure is not limited thereto. In another embodiment, the display apparatus 1 of the disclosure may be a display apparatus such as a quantum dot light-emitting display apparatus. For example, an emission layer of a display element included in the display apparatus 1 may include an organic material, an inorganic material, a quantum dot, an organic material and a quantum dot, or an inorganic material and a quantum dot.

Although FIG. 1 illustrates that one opening area OA is included and the opening area OA is substantially circular, the disclosure is not limited thereto. The number of opening areas OA may be two or more, and the shape of each opening area OA may be variously changed, such as a circular shape, an oval shape, a polygonal shape, a diamond shape, a bar shape, or the like.

Also, the display apparatus 1 of FIG. 1 is illustrated as including the display area DA provided as a flat surface, but at least a portion of the display apparatus 1 may be foldable, bendable, or rollable. In this case, at least a portion of the display area DA may have a curved surface.

FIG. 2 is a schematic cross-sectional view of the display apparatus 1 of FIG. 1, taken along line A-A'.

As shown in FIG. 2, the display apparatus 1 may include a display panel 10, and an input sensing layer 40 and an optical functional layer 50, which are disposed on the display panel 10. The display panel 10, the input sensing layer 40, and the optical functional layer 50 may be covered by a cover window 60. The display apparatus 1 may be various types of electronic devices, such as a mobile phone, a notebook, or a smart watch.

The display panel 10 may display an image. The display panel 10 includes pixels arranged in the display area DA. The pixels may include a display element and a pixel circuit connected to the display element. The display element may include an organic light-emitting diode, a quantum dot organic light-emitting diode, or the like.

The input sensing layer 40 may obtain coordinate information according to an external input, for example, a touch event. The input sensing layer 40 may include a sensing electrode (or touch electrode) and a trace line connected to the sensing electrode. The input sensing layer 40 may be disposed on the display panel 10. The input sensing layer 40 may sense an external input in a mutual-cap method and/or a self-cap method.

The input sensing layer 40 may be formed directly on the display panel 10 or formed separately and then bonded to the display panel 10 through an adhesive layer such as an optical clear adhesive. For example, the input sensing layer 40 may be formed continuously after a process of forming the display panel 10. In this case, the input sensing layer 40 may be understood as a portion of the display panel 10, and an adhesive layer may not be between the input sensing layer 40 and the display panel 10. FIG. 2 illustrates that the input sensing layer 40 is disposed between the display panel 10 and the optical functional layer 50, but the input sensing layer 40 may be disposed above the optical functional layer 50 in another embodiment.

The optical functional layer 50 may include an anti-reflection layer. The anti-reflection layer may reduce the reflectance of light incident from the outside (external light) toward the display panel 10 through the cover window 60. The anti-reflection layer may include a retarder and a polarizer. In another embodiment, the anti-reflection layer may include a black matrix and color filters. Also, the optical functional layer 50 may include a lens layer. The lens layer may improve light output efficiency of the light emitted from the display panel 10 or reduce color deviation. The optical functional layer 50 may include all of the anti-reflection layer and the lens layer described above, or may include any one of the anti-reflection layer and the lens layer.

In an embodiment, the optical functional layer 50 may be formed continuously after a process of forming the display panel 10 and/or the input sensing layer 40. In this case, an adhesive layer may not be between the optical functional layer 50 and the display panel 10 and/or between the optical functional layer 50 and the input sensing layer 40.

A plurality of opening portions may be defined in the display panel 10, the input sensing layer 40, and/or the optical functional layer 50. In this regard, FIG. 2 illustrates that first to third opening portions 10H, 40H, and 50H may be defined in the display panel 10, the input sensing layer 40, and the optical functional layer 50 respectively, and the first to third opening portions 10H, 40H, and 50H overlap each other. Each of the first to third opening portions 10H, 40H, and 50H corresponds to the opening area OA.

In another embodiment, a plurality of opening portions may not be defined in one or more of the display panel 10, the input sensing layer 40, and the optical functional layer 50. For example, opening portions may not be defined in one or two components selected from the display panel 10, the input sensing layer 40, and the optical functional layer 50.

As described above, the opening area OA may be a type of component area (e.g., a sensor area, a camera area, a speaker area, or the like) where a component 20 configured to add various functions to the display apparatus 1 is located. The component 20 may be located in the first to third opening portions 10H, 40H, and 50H, as shown in FIG. 2. Alternatively, the component 20 may be disposed below the display panel 10.

The component 20 may include an electronic element. For example, the component 20 may be an electronic element using light or sound. For example, the electronic element may include a sensor outputting and/or receiving light, such as an infrared sensor, a camera capturing an image by receiving light, a sensor outputting and sensing light or sound to measure a distance or recognize a fingerprint, a small lamp outputting light, a speaker outputting sound, or the like. An electronic element using light may use light of various wavelengths, such as visible light, infrared light, ultraviolet light, or the like. In some embodiments, the opening area OA may be understood as a transmission area through which light and/or sound output from the component 20 to the outside or from the outside to an electronic element may pass.

In another embodiment, when the display apparatus 1 is used as a smart watch or an instrument panel for vehicles, the component 20 may be a member such as the hand of a clock or a needle indicating certain information (for example, speed of a vehicle or the like). When the display apparatus 1 includes the hand of a clock or the instrument panel for vehicles, the component 20 may be exposed to the outside through the cover window 60, and the cover window 60 may include an opening corresponding to the opening area OA.

The component 20 may include component(s) associated with a function of the display panel 10 as described above, or may include a component, such as accessories, that increase aesthetics of the display panel 10.

Figure 3:
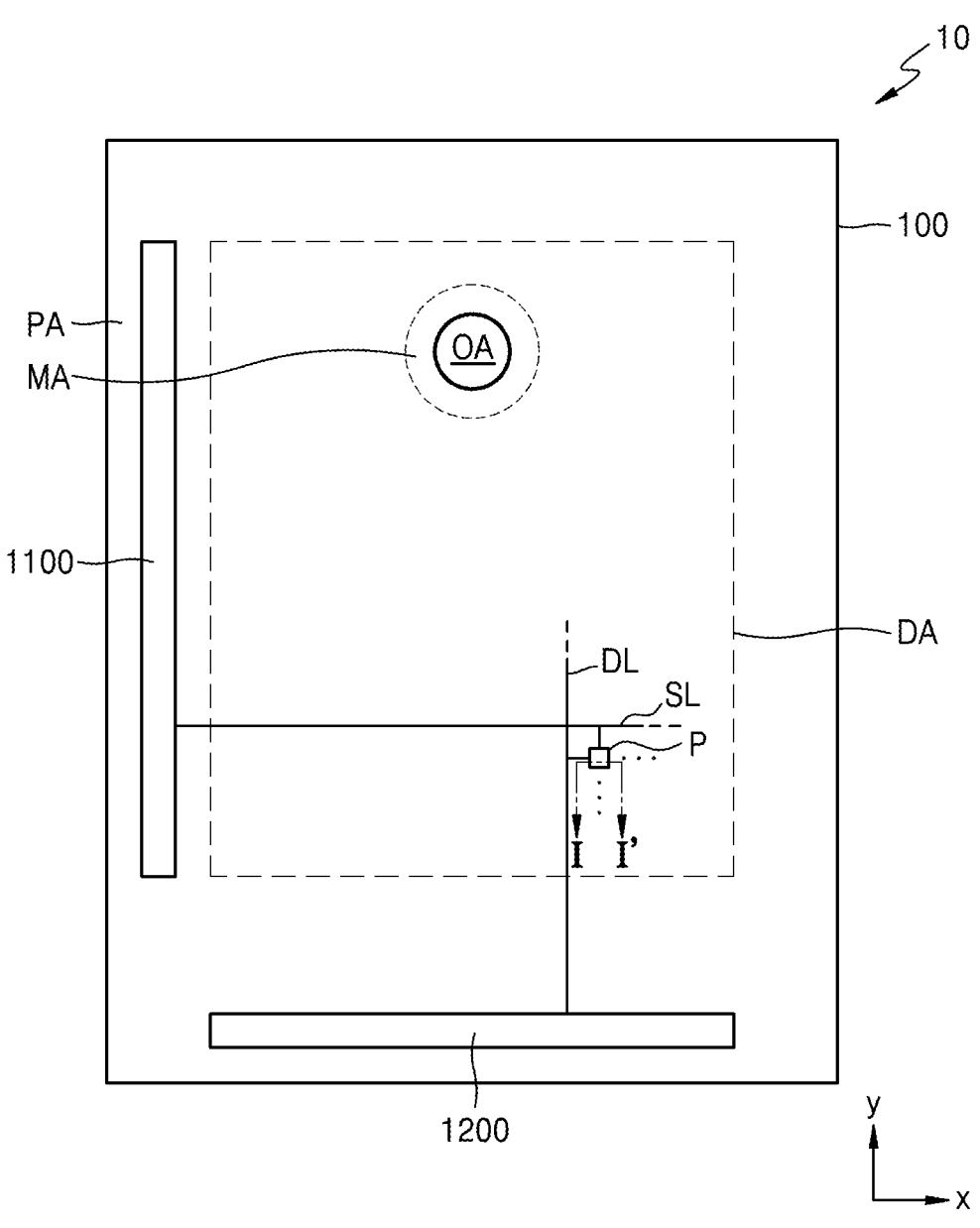
FIG. 3 is a schematic plan view of a display panel of the display apparatus of FIG. 1.
Figure 4:
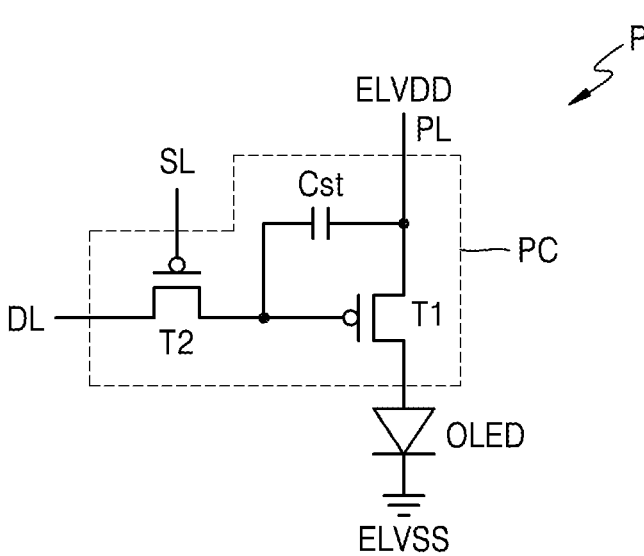
FIG. 4 is an equivalent circuit diagram schematically illustrating any one pixel included in the display panel of FIG. 3.

FIG. 3 is a schematic plan view of the display panel 10 of the display apparatus of FIG. 1, and FIG. 4 is an equivalent circuit diagram schematically illustrating any one pixel included in the display panel of FIG. 3.

Referring to FIG. 3, the opening area OA may be defined in the display panel 10, and the display panel 10 may include the display area DA, the middle area MA, and the peripheral area PA. For convenience of explanation, it may be understood that a substrate 100 of the display panel 10 has the opening area OA, the display area DA, the middle area MA, and the peripheral area PA.

The display panel 10 includes a plurality of pixels P arranged in the display area DA. As shown in FIG. 4, each of the plurality of pixels P may include a pixel circuit PC and an organic light-emitting diode OLED as a display element connected to the pixel circuit PC. The pixel circuit PC may include a first thin-film transistor T1, a second thin-film transistor T2, and a storage capacitor Cst. Each pixel P may emit, for example, red, green, blue, or white light from the organic light-emitting diode OLED.

The second thin-film transistor T2 is a second thin-film transistor, which may be connected to a scan line SL and a data line DL, and may be configured to provide, the first thin-film transistor T1, a data voltage input to the data line DL, based on a switching voltage input to the scan line SL. The storage capacitor Cst may be connected to the second thin-film transistor T2 and a driving voltage line PL and store a voltage corresponding to a difference between a voltage received from the second thin-film transistor T2 and a first power supply voltage ELVDD supplied to the driving voltage line PL.

The first thin-film transistor T1 is a driving thin-film transistor, which may be connected to the driving voltage line PL and the storage capacitor Cst and control a driving current flowing from the driving voltage line PL through the organic light-emitting diode OLED in accordance with a voltage value stored in the storage capacitor Cst. The organic light-emitting diode OLED may emit light having a certain brightness according to the driving current. An opposite electrode (e.g., a cathode) of the organic light-emitting diode OLED may receive a second power supply voltage ELVSS.

The middle area MA may surround the opening area OA in a plan view. The middle area MA is an area in which a display element, such as an organic light-emitting diode emitting light, is not arranged, and signal lines providing signals to the pixels P arranged around the opening area OA may pass by the middle area MA. A scan driver 1100 providing a scan signal to each pixel P, a data driver 1200 providing a data signal to each pixel P, and a main power-supply interconnection (not shown) configured to providing the first power supply voltage ELVDD and the second power supply voltage ELVSS, or the like may be arranged in the peripheral area PA. FIG. 3 illustrates that the data driver 1200 is arranged adjacent to one side of the substrate 100, but according to an embodiment, the data driver 1200 may be arranged on a flexible printed circuit board (FPCB) electrically connected to a pad arranged on one side of the display panel 10.

FIG. 4 illustrates that the pixel circuit PC includes two thin-film transistors and one storage capacitor, but the disclosure is not limited thereto. The number of thin-film transistors and the number of storage capacitors may be variously changed according to the design of the pixel circuit PC. For example, the pixel circuit PC may further include four or more thin-film transistors in addition to the above-mentioned two thin-film transistors. In an embodiment, the pixel circuit PC may include seven thin-film transistors and one storage capacitor.

Figure 5:
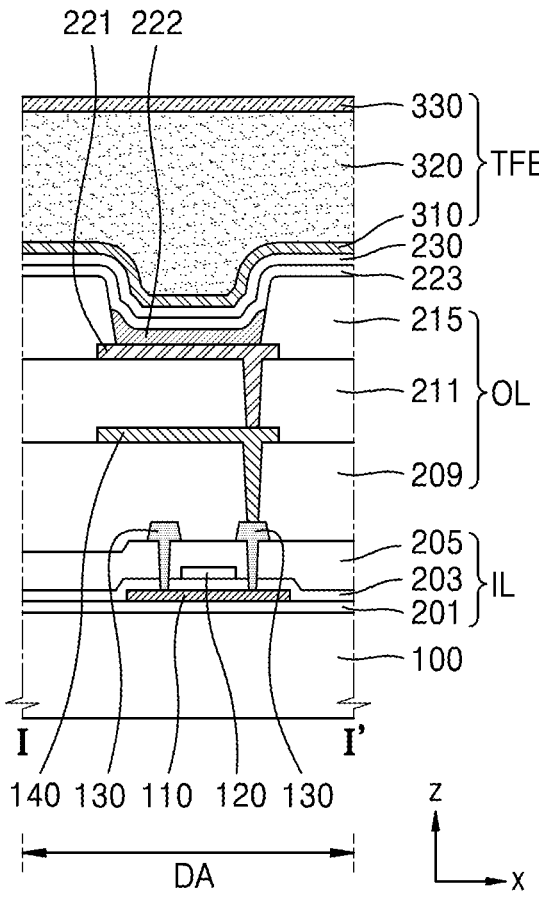
FIG. 5 is a schematic cross-sectional view of a display area of the display panel of FIG. 3, taken along line I-I'.

FIG. 5 is a schematic cross-sectional view of the display area of the display panel of FIG. 3, taken along line I-I'.

As described above, the substrate 100 may include areas corresponding to the display area DA and the peripheral area PA outside the display area DA. The substrate 100 may include various materials which are flexible or bendable. For example, the substrate 100 may include glass, metal, or a polymer resin.

Also, the substrate 100 may include a polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 may have a multi-layered structure including two layers each including the polymer resin and a barrier layer including an inorganic material (for example, silicon oxide, silicon nitride, silicon oxynitride, or the like) arranged between the two layers, and various modifications may be made.

A buffer layer 201 may be disposed on the substrate 100. The buffer layer 201 may function as a barrier layer and/or a blocking layer configured to prevent impurity ions from diffusing, prevent moisture or external air from penetrating, and planarize the surface of the substrate 100.

The buffer layer 201 may include silicon oxide, silicon nitride, or silicon oxynitride. Also, the buffer layer 201 may adjust a heat supply rate during a crystallization process for forming a semiconductor layer 110 so that the semiconductor layer 110 is uniformly crystallized.

The semiconductor layer 110 may be on the buffer layer 201. The semiconductor layer 110 may include polysilicon, and may include a channel area not doped with an impurity, and a source area and a drain area, which are respectively formed by doping impurities on both sides of the channel area. Here, the impurity varies depending on the type of thin-film transistor, and may be an N-type impurity or a P-type impurity.

A gate insulating film 203 may be on the semiconductor layer 110. The gate insulating film 203 may be configured to secure insulation between the semiconductor layer 110 and a gate layer 120. The gate insulating film 203 may include an inorganic material, such as silicon oxide, silicon nitride, and/or silicon oxynitride, and may be between the semiconductor layer 110 and the gate layer 120.

Also, the gate insulating film 203 may have a shape corresponding to the entire surface of the substrate 100, and may have a structure in which contact holes are formed in a predetermined portion thereof. As such, an insulating film including an inorganic material may be formed through chemical vapor deposition (CVD) or atomic layer deposition (ALD). The above description is similar to the embodiments and modification examples thereof to be described below.

The gate layer 120 may be on the gate insulating film 203. The gate layer 120 may be arranged at a position vertically overlapping the semiconductor layer 110, and may include at least one metal from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and copper (Cu).

An interlayer insulating film 205 may be disposed on the gate layer 120. The interlayer insulating film 205 may cover the gate layer 120. The interlayer insulating film 205 may include an inorganic material. For example, the interlayer insulating film 205 may include a metal oxide or a metal nitride, and in particular, the inorganic material may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZrO_2$), or the like. In some embodiments, the interlayer insulating film 205 may have a double structure of $SiO_x/SiN_y$ or $SiN_x/SiO_y$.

Hereinafter, an inorganic insulating layer IL used in the disclosure may be a concept including the buffer layer 201, the gate insulating film 203, and the interlayer insulating film 205 described above.

A first conductive layer 130 may be disposed on the interlayer insulating film 205. The first conductive layer 130 function as an electrode connected to the source/drain area of the semiconductor layer 110 through a through hole included in the interlayer insulating film 205. The first conductive layer 130 may include one or more metals selected from among Al, Pt, Pd, Ag, Mg, Au, Ni, Nd, Ir, Cr, Li, Ca, Mo, Ti, W, and Cu. For example, the first conductive layer 130 may include a Ti layer, an Al layer, and/or a Cu layer.

A first organic insulating layer 209 may be disposed on the first conductive layer 130. The first organic insulating layer 209 may cover an upper portion of the first conductive layer 130 and have a substantially flat upper surface to function as a planarization film. The first organic insulating layer 209 may include, for example, an organic material, such as acryl, benzocyclobutene (BCB), hexamethyldisiloxane (HMDSO), or the like. The first organic insulating layer 209 may be modified in various ways, such as being configured as a single layer or a multi-layer.

A second conductive layer 140 may be disposed on the first organic insulating layer 209. The second conductive layer 140 may function as an electrode connected to the source/drain area of the semiconductor layer 110 through a through hole included in the interlayer insulating film 205. The second conductive layer 140 may include one or more metals selected from among Al, Pt, Pd, Ag, Mg, Au, Ni, Nd, Ir, Cr, Li, Ca, Mo, Ti, W, and Cu. For example, the second conductive layer 140 may include a Ti layer, an Al layer, and/or a Cu layer.

A second organic insulating layer 211 may be disposed on the second conductive layer 140 and the first organic insulating layer 209. The second organic insulating layer 211 may cover an upper portion of the second conductive layer 140 and have a substantially flat upper surface to function as a planarization film. The second organic insulating layer 211 may include, for example, an organic material, such as acryl, BCB, HMDSO, or the like. The second organic insulating layer 211 may be modified in various ways, such as being configured as a single layer or a multi-layer.

Also, although not illustrated in FIG. 5, an additional conductive layer and an additional insulating layer may be between a conductive layer and a pixel electrode, and may be applied to various embodiments. At this time, the additional conductive layer may include the same material as the above-described conductive layer and may have the same layer structure. The additional insulating layer may include the same material as the above-described organic insulating layer and may have the same layer structure. A pixel electrode 221 may be disposed on the second organic insulating layer 211.

The pixel electrode 221 may be connected to the second conductive layer 140 through a contact hole formed in the second organic insulating layer 211. A display element may be disposed on the pixel electrode 221. The organic light-emitting diode OLED may be used as the display element. That is, the organic light-emitting diode OLED may be, for example, disposed on the pixel electrode 221. The pixel electrode 221 may include a transparent conductive layer including a transparent conductive oxide, such as ITO, In$_2$O$_3$, IZO, or the like, and a reflective layer including a metal, such as Al, Ag, or the like. For example, the pixel electrode 221 may have a triple-layered structure of ITO/Ag/ITO.

A pixel defining layer 215 may be disposed on the second organic insulating layer 211 and the pixel electrode 221, and may be arranged to cover the edge of the pixel electrode 221. That is, the pixel defining layer 215 may cover the edge of the pixel electrode 221. The pixel defining layer 215 may be an opening portion corresponding to the pixel P, and the opening portion may be formed to expose at least a central portion of the pixel electrode 221. The pixel defining layer 215 may include, for example, an organic material, such as polyimide, HMDSO, or the like.

Hereinafter, an organic insulating film OL used in the disclosure may be a concept including the first organic insulating layer 209, the second organic insulating layer 211, and the pixel defining layer 215.

An intermediate layer 222 and an opposite electrode 223 may each be disposed on the opening portion of the pixel defining layer 215. The intermediate layer 222 may include a low-molecular-weight material or a polymer material. When the intermediate layer 222 includes a low-molecular-weight material, the intermediate layer 222 may include a hole injection layer, a hole transport layer, an emission layer, an electron transport layer, and/or an electron injection layer. When the intermediate layer 222 includes a polymer material, the intermediate layer 222 may usually have a structure including the hole transport layer and the emission layer.

The opposite electrode 223 may include a transparent conductive layer including a transparent conductive oxide, such as ITO, In$_2$O$_3$, IZO, or the like, or may include a metallic conductive layer of Ag, Mg, or the like. Alternatively, the opposite electrode 223 may include at least two layers including the above materials.

The pixel electrode 221 may be used as an anode, and the opposite electrode 223 may be used as a cathode. The polarities of the electrodes may be applied in reverse. The structure of the intermediate layer 222 is not limited to the above, and may have various structures. For example, at least one of layers configuring the intermediate layer 222 may be integrally formed with the opposite electrode 223. In another embodiment, the intermediate layer 222 may include a layer patterned to correspond to each of a plurality of pixel electrodes 221.

The opposite electrode 223 may be arranged in the display area DA, and may be arranged to cover the entire surface of the display area DA. That is, the opposite electrode 223 may be integrally formed to cover a plurality of pixels. The opposite electrode 223 may be in electrical contact with a common power supply line (not shown) arranged in the peripheral area PA. In an embodiment, the opposite electrode 223 may also cover a blocking wall to be described below.

A capping layer 230 may be disposed on the opposite electrode 223. For example, the capping layer 230 may include lithium fluoride (LiF) and may be formed by thermal deposition. In some embodiments, the capping layer 230 may be omitted.

A thin-film encapsulation layer TFE may entirely cover the display area DA and extend toward the peripheral area PA to cover at least a portion of the peripheral area PA. The thin-film encapsulation layer TFE may extend to the outside of the common power supply line (not shown).

The thin-film encapsulation layer TFE may include a first inorganic encapsulation layer 310, a second inorganic encapsulation layer 330, and an organic encapsulation layer 320 therebetween. The first inorganic encapsulation layer 310 and the second inorganic encapsulation layer 330 may each include one or more inorganic materials from among aluminum oxide, titanium oxide, tantalum oxide, hafnium oxide, zinc oxide, silicon oxide, silicon nitride, and silicon oxynitride. The first inorganic encapsulation layer 310 and the second inorganic encapsulation layer 330 may each be a single layer or a multi-layer, each including the material described above. The first inorganic encapsulation layer 310 and the second inorganic encapsulation layer 330 may include the same material or may include different materials.

The thickness of the first inorganic encapsulation layer 310 and the thickness of the second inorganic encapsulation layer 330 may be different from each other. The thickness of the first inorganic encapsulation layer 310 may be greater than the thickness of the second inorganic encapsulation layer 330. Alternatively, the thickness of the second inorganic encapsulation layer 330 may be greater than the thickness of the first inorganic encapsulation layer 310, or the first inorganic encapsulation layer 310 and the second inorganic encapsulation layer 330 may have the same thickness.

The organic encapsulation layer 320 may include a monomer-based material or a polymer-based material. The polymer-based material may include acrylic resin, epoxy resin, polyimide, polyethylene, or the like. In an embodiment, the organic encapsulation layer 320 may include acrylate.

Figure 6:
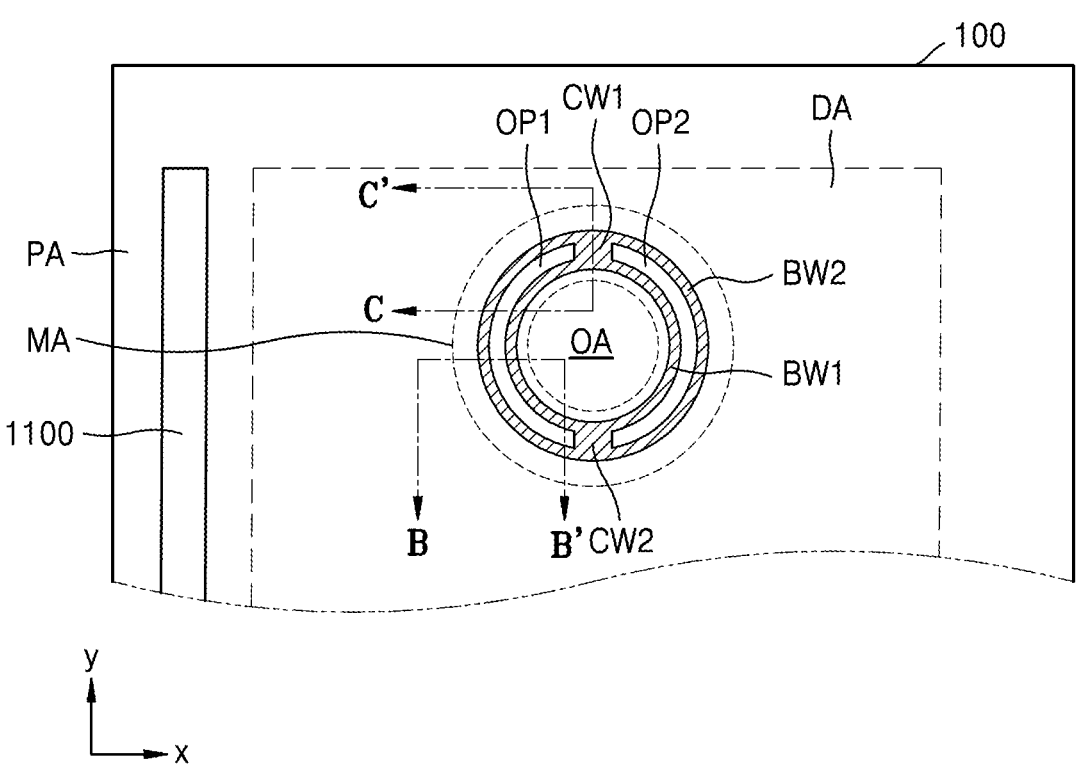
FIG. 6 is a plan view schematically illustrating a vicinity of an opening area in the display panel of FIG. 3.

FIG. 6 is a plan view schematically illustrating a vicinity of the opening area in the display panel of FIG. 3. In the description of FIG. 6, contents already given above may be omitted.

As shown in FIG. 6, a display panel according to an embodiment may include the substrate 100 described above, a first blocking wall BW1, a second blocking wall BW2, and a first connection wall CW1.

As described above, the opening area OA may be defined in the substrate, and the substrate 100 may include the display area DA surrounding at least a portion of the opening area OA and the middle area MA disposed between the opening area OA and the display area DA. The substrate 100 may have a shape similar to a square or rectangle, and may have a first width in a first direction and a second width in a second direction crossing the first direction. At this time, the first width may be equal to or less than the second width, and preferably, the first width may be less than the second width.

At this time, the first direction may be an x-axis direction of FIG. 6, and the first direction may mean a horizontal length direction of the substrate 100 (or the display panel 10). The second direction may mean an y-axis direction of FIG. 6, and the second direction may mean a vertical length direction of the substrate 100 (or the display panel 10) perpendicular to the first direction. In general, the substrate 100 (or the display panel 10) may have a shape similar to a rectangle, and the horizontal length thereof may be less than the vertical length thereof.

The opening area OA may generally have a closed curve shape or a circular shape, and may also have various other shapes. In the disclosure, the center of the opening area OA may mean a point that becomes a standard for symmetry when the edge of the opening area OA has symmetry. Alternatively, the center of the opening area OA may mean a point where the longest straight line among virtual straight lines connecting two points configuring the edge of the opening area OA in the first direction and the longest straight line among virtual straight lines connecting two points in the second direction intersect with each other.

The first blocking wall BW1 may be arranged in the middle area MA to surround the opening area OA, and may be disposed on the substrate 100. In particular, the first blocking wall BW1 may be disposed on the inorganic insulating layer IL disposed on the substrate 100. Also, the first blocking wall BW1 may include a first upper surface. The first blocking wall BW1 may have the same layer structure as the second blocking wall BW2 to be described below, and may have the same material as the second blocking wall BW2 to be described below.

The second blocking wall BW2 may be arranged in the middle area MA to surround the first blocking wall BW1, and may be disposed on the substrate 100. In particular, the second blocking wall BW2 may be disposed on the inorganic insulating layer IL disposed on the substrate 100. Also, the second blocking wall BW2 may include a second upper surface. The second blocking wall BW2 may have the same layer structure as the first blocking wall BW1, and may include the same material as the first blocking wall BW1.

The first connection wall CW1 may be disposed between the first blocking wall BW1 and the second blocking wall BW2. In particular, the first connection wall CW1 may be disposed on the inorganic insulating layer IL disposed on the substrate 100. The first connection wall CW1 may connect the first blocking wall BW1 and the second blocking wall BW2 to each other. That is, an upper surface of the first connection wall CW1 may form a continuous surface with the first upper surface of the first blocking wall BW1 and/or the second upper surface of the second blocking wall BW2 described above. Also, the first connection wall CW1 may have the same layer structure as the first blocking wall BW1 and/or the second blocking wall BW2, and may include the same material as the first blocking wall BW1 and/or the second blocking wall BW2.

The upper surface of the first connection wall CW1 may form a continuous surface with the first upper surface of the first blocking wall BW1 and the second upper surface of the second blocking wall BW2 described above, and accordingly, the first blocking wall BW1, the second blocking wall BW2, and the first connection wall CW1 may be integrally formed.

Alternatively, the upper surface of the first connection wall CW1 may form a continuous surface with the first upper surface of the first blocking wall BW1, the second upper surface of the second blocking wall BW2 described above, and an upper surface of a second connection wall CW2, and accordingly, the first blocking wall BW1, the second blocking wall BW2, the first connection wall CW1, and the second connectional wall CW2 may be integrally formed.

The display panel 10 according to an embodiment may further include the second connectional wall CW2. The upper surface of the second connectional wall CW2 may form a continuous surface with the first upper surface of the first blocking wall BW1 and the second upper surface of the second blocking wall BW2 described above, and accordingly, the first blocking wall BW1, the second blocking wall BW2, and the second connectional wall CW2 may be integrally formed.

The second connectional wall CW2 may be disposed between the first blocking wall BW1 and the second blocking wall BW2, and may be spaced apart from the first connection wall CW1 along the second direction. In particular, the second connectional wall CW2 may be disposed on the inorganic insulating layer IL disposed on the substrate 100. The second connectional wall CW2 may connect the first blocking wall BW1 and the second blocking wall BW2 to each other. That is, the upper surface of the second connectional wall CW2 may form a continuous surface with the first upper surface of the first blocking wall BW1 and/or the second upper surface of the second blocking wall BW2 described above. Also, the second connectional wall CW2 may have the same layer structure as the first blocking wall BW1 and/or the second blocking wall BW2, and may include the same material as the first blocking wall BW1 and/or the second blocking wall BW2.

In addition, a first distance from the upper surface of the substrate 100 to the first upper surface of the first blocking wall BW1, a second distance from the upper surface of the substrate 100 to the second upper surface of the second blocking wall BW2, and a third distance from the upper surface of the substrate 100 to the upper surface of the first connection wall CW1 may have the same size.

Similarly, the first distance from the upper surface of the substrate 100 to the first upper surface of the first blocking wall BW1, the second distance from the upper surface of the substrate 100 to the second upper surface of the second blocking wall BW2, the third distance from the upper surface of the substrate 100 to the upper surface of the first connection wall CW1, and a fourth distance from the upper surface of the substrate 100 to the upper surface of the second connectional wall CW2 may have the same size.

The first connection wall CW1 and the second connectional wall CW2 may be disposed on a virtual straight line passing through the center of the opening area OA, and the virtual straight line on which the first connection wall CW1 and the second connectional wall CW2 are positioned may be parallel to the second direction described above.

The opening area OA described above may be positioned at the center of the substrate 100 in the first direction. The opening area OA may also be positioned at a position biased toward one side in the first direction, and may receive stress due to a tensile force applied in parallel to the first direction by a pad (PAD, FIG. 14), as to be described below. As to be described below, the opening area OA may receive a tensile force in parallel to the first direction by the pad (PAD, refer to FIG. 14) to receive a greater stress at a point where the first connection wall CW1 and the second connectional wall CW2 are positioned.

As such, as described in the disclosure, the first connection wall CW1 and the second connectional wall CW2 may be positioned at a point where stress generated by the tensile force in parallel to the first direction is great. Through the positional characteristics of the first connection wall CW1 and the second connectional wall CW2, the display panel 10 according to an embodiment may have a structure that is more robust against stress due to a tensile force.

Also, when the areas of the first connection wall CW1 and the second connectional wall CW2 are excessively wide when viewed from a vertical direction of the display panel 10, the two blocking walls may actually function as one blocking wall. That is, the first blocking wall BW1 and the second blocking wall BW2, which actually function as one blocking wall, are difficult to prevent an overflow phenomenon of an organic material, as compared to the first blocking wall BW1 and the second blocking wall BW2, which function as two completely separated blocking walls. Accordingly, it is necessary not to form a connection wall at un unnecessary point, and it is preferable not to form a connection wall at a point other than the point where the first connection wall CW1 and the second connectional wall CW2 are positioned.

As shown in FIG. 6, to prevent the overflow of the organic material of the organic encapsulation layer 320, a first opening OP1 and a second opening OP2 may each be arranged between the first blocking wall BW1 and the second blocking wall BW2. The first opening OP1 and the second opening OP2 may each be disposed between the first blocking wall BW1 and the second blocking wall BW2. When viewed from a plan, the second opening OP2 may be positioned to be symmetrical with the first opening OP1, based on the center of the opening area OA.

When viewed from a plan, the first opening OP1 and the second opening OP2 may be positioned on a virtual straight line being parallel to the first direction and passing through the center of the opening area OA. Also, when viewed from a plan, the first opening OP1 and the second opening OP2 may have a symmetrical shape with respect to a virtual straight line extending in the second direction intersecting with the first direction and passing through the center of the opening area OA in the second direction.

Figure 7:
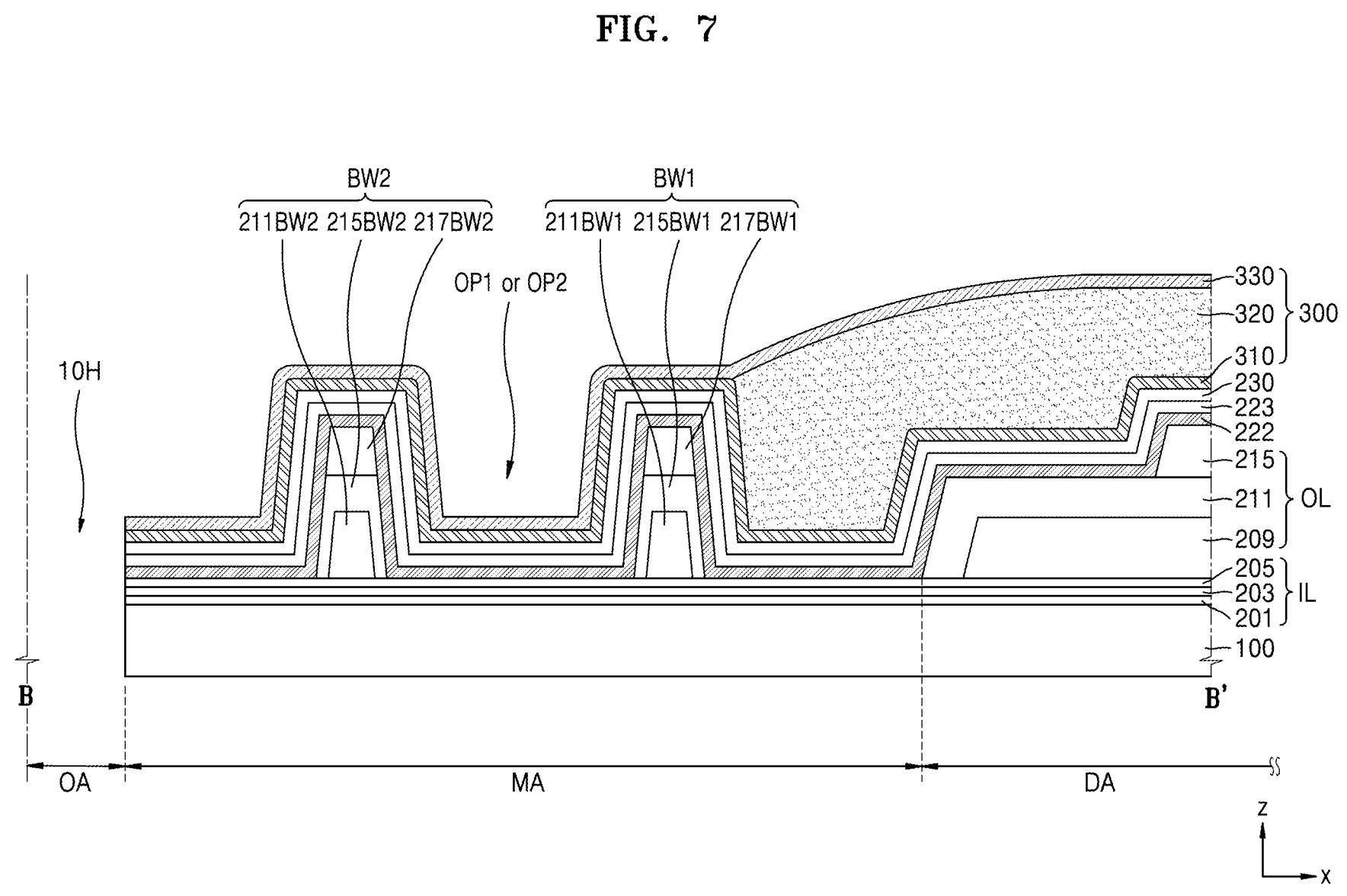

FIG. 7 is a schematic cross-sectional view of an example of the display panel of FIG. 6, taken along line B-B'.

In an embodiment, the display area DA may be defined as an area where the first organic insulating layer 209 and/or the second organic insulating layer 211, which are organic layers, are arranged as described above. A portion of a multi-layered structure for forming the organic light-emitting diode OLED may extend and be disposed on insulating layers in the display area DA.

As shown in FIG. 7, the middle area MA is an area disposed between the display area DA and the opening area OA, and may include at least one of the first and second blocking walls BW1 and BW2. The middle area MA may function to prevent foreign materials or moisture from penetrating into the display area DA through the opening area OA.

The first blocking wall BW1 may be arranged in the middle area MA. The first blocking wall BW1 may be disposed on the inorganic insulating layer IL extending to the middle area MA. The first blocking wall BW1 may prevent the organic encapsulation layer 320 of a thin-film encapsulation layer 300 from overflowing to the opening area OA.

In the middle area MA, not only the first blocking wall BW1 but also the second blocking wall BW2 may be additionally arranged. The first blocking wall BW1 and the second blocking wall BW2 may be spaced apart from each other by a certain interval along the first direction. The second blocking wall BW2 may be disposed on the inorganic insulating layer IL extending to the middle area MA. The organic encapsulation layer 320 of the thin-film encapsulation layer 300 may be prevented from overflowing to the opening area OA by further arranging the second blocking wall BW2.

In an embodiment, the first blocking wall BW1 may include first-1, first-2, and first-3 blocking layers 211BW1, 215BW1, and 217BW1. The first-1 blocking layer 211BW1 of the first blocking wall BW1 may have the same layer structure and the same material as first organic insulating layer 209 or the second organic insulating layer 211.

The first-2 blocking layer 215BW1 of the first blocking wall BW1 may be disposed on the first-1 blocking layer 211BW1 and have the same layer structure and the same material as the pixel defining layer 215. At this time, in some cases, the first-2 blocking layer 215BW1 may entirely cover the first-1 blocking layer 211BW1. That is, the first-2 blocking layer 215BW1 may cover the left, right, and top portions of the first-1 blocking layer 211BW1.

The first-3 blocking layer 217BW1 may be disposed on the first-2 blocking layer 215BW1 and have the same layer structure and the same material as a spacer (not shown) disposed on the pixel defining layer 215. The first and second inorganic encapsulation layers 310 and 330 may be above the first-3 blocking layer 217BW1 or the first blocking wall BW1.

In an embodiment, the second blocking wall BW2 may include second-1, second-2, and second-3 blocking layers 211BW2, 215BW2, and 217BW2. The second-1 blocking layer 211BW2 of the second blocking wall BW2 may have the same layer structure and the same material as the first organic insulating layer 209 or the second organic insulating layer 211.

The second-2 blocking layer 215BW2 of the second blocking wall BW2 may be disposed on the second-1 blocking layer 211BW2 and have the same layer structure and the same material as the pixel defining layer 215. At this time, in some cases, the second-2 blocking layer 215BW2 may entirely cover the second-1 blocking layer 211BW2. That is, the second-2 blocking layer 215BW2 may cover the left, right, and top portions of the second-1 blocking layer 211BW2.

The second-3 blocking layer 217BW2 may be disposed on the second-2 blocking layer 215BW2 and have the same layer structure and the same material as the spacer 217. The first and second inorganic encapsulation layers 310 and 330 may be above the second-3 blocking layer 217BW2 or the second blocking wall BW2.

That is, the first inorganic encapsulation layer 310 and the second inorganic encapsulation layer 330 may each extend to the opening area OA to cover upper surfaces and side surfaces of the first blocking wall BW1 and the second blocking wall BW2.

Figure 8:
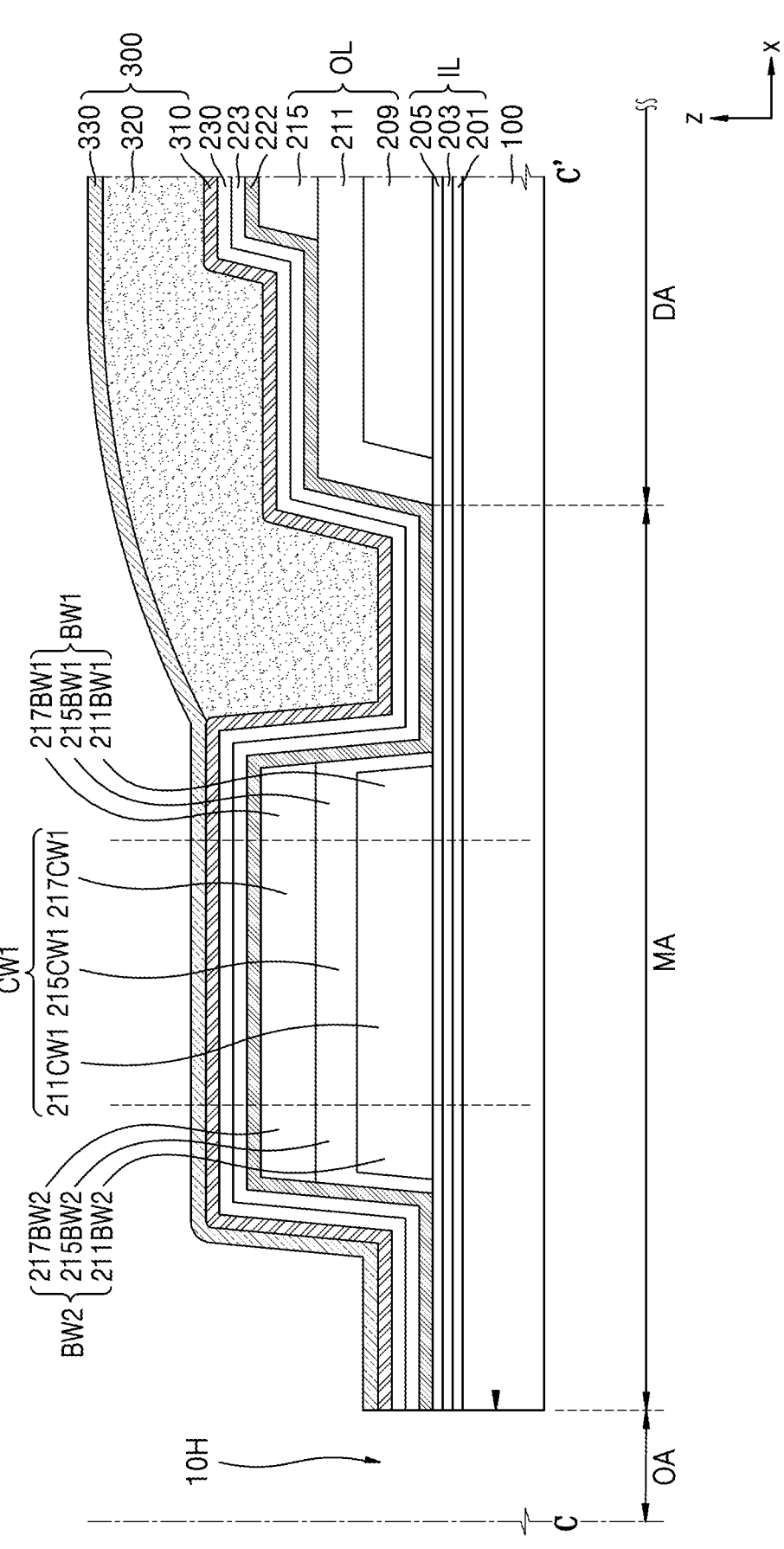
FIG. 8 is a schematic cross-sectional view of the display panel of FIG. 6, taken along line C-C'.

FIG. 8 is a schematic cross-sectional view of the display panel of FIG. 6, taken along line C-C'. In the description of FIG. 8, descriptions already given above may be omitted.

As shown in FIG. 8, the first connection wall CW1 may be between the first blocking wall BW1 and the second blocking wall BW2, and may be integrally formed with the first blocking wall BW1 and the second blocking wall BW2. Also, the upper surface of the first connection wall CW1 may form a continuous surface with the first upper surface of the first blocking wall BW1 and the second upper surface of the second blocking wall BW2. In the cross-sectional view, the first connection wall CW1, the first blocking wall BW1, and the second blocking wall BW2 may form one blocking wall.

In an embodiment, the first connection wall CW1 may include first-1, first-2, and first-3 connection layers 211CW1, 215CW1, and 217CW1. The first-1 connection layer of the first connection wall CW1 may have the same layer structure and the same material as the first organic insulating layer 209 or the second organic insulating layer 211.

The first-2 connection layer 215CW1 of the first connection wall CW1 may be disposed on the first-1 connection layer 211CW1 and have the same structure layer and the same material as the pixel defining layer 215. At this time, in some cases, the first-2 connection layer 215CW1 may entirely cover the first-1 connection layer. That is, the first-2 connection layer 215CW1 may cover the left, right, and top portions of the first-1 connection layer 211CW1.

The first-3 connection layer 217CW1 may be disposed on the first-2 connection layer 215CW1 and have the same layer structure and the same material as the spacer 217. The first and second inorganic encapsulation layers 310 and 330 may be above the first-3 connection layer 217CW1 or the first connection wall CW1.

That is, the first inorganic encapsulation layer 310 and the second inorganic encapsulation layer 330 may each extend to the opening area OA, and may cover the upper surface of the first connection wall CW1 as well as the upper surfaces and side surfaces of the first blocking wall BW1 and the second blocking wall BW2.

Although not illustrated in FIG. 8, the second connectional wall CW2 as described above may have a multi-layered structure, and the multi-layered structure of the second connectional wall CW2 may have the same layer structure as the multi-layered structure of the first connection wall CW1. Also, the first inorganic encapsulation layer 310 and the second inorganic encapsulation layer 330 may cover the upper surface of the second connectional wall CW2.

Also, as shown in FIG. 8, as the first connection wall CW1 is arranged in an area SA2 (refer to FIG. 9) disposed between the first blocking wall BW1 and the second blocking wall BW2, an opening in which a sacrificial layer is arranged may not be arranged in the area SA2.

Figure 9:
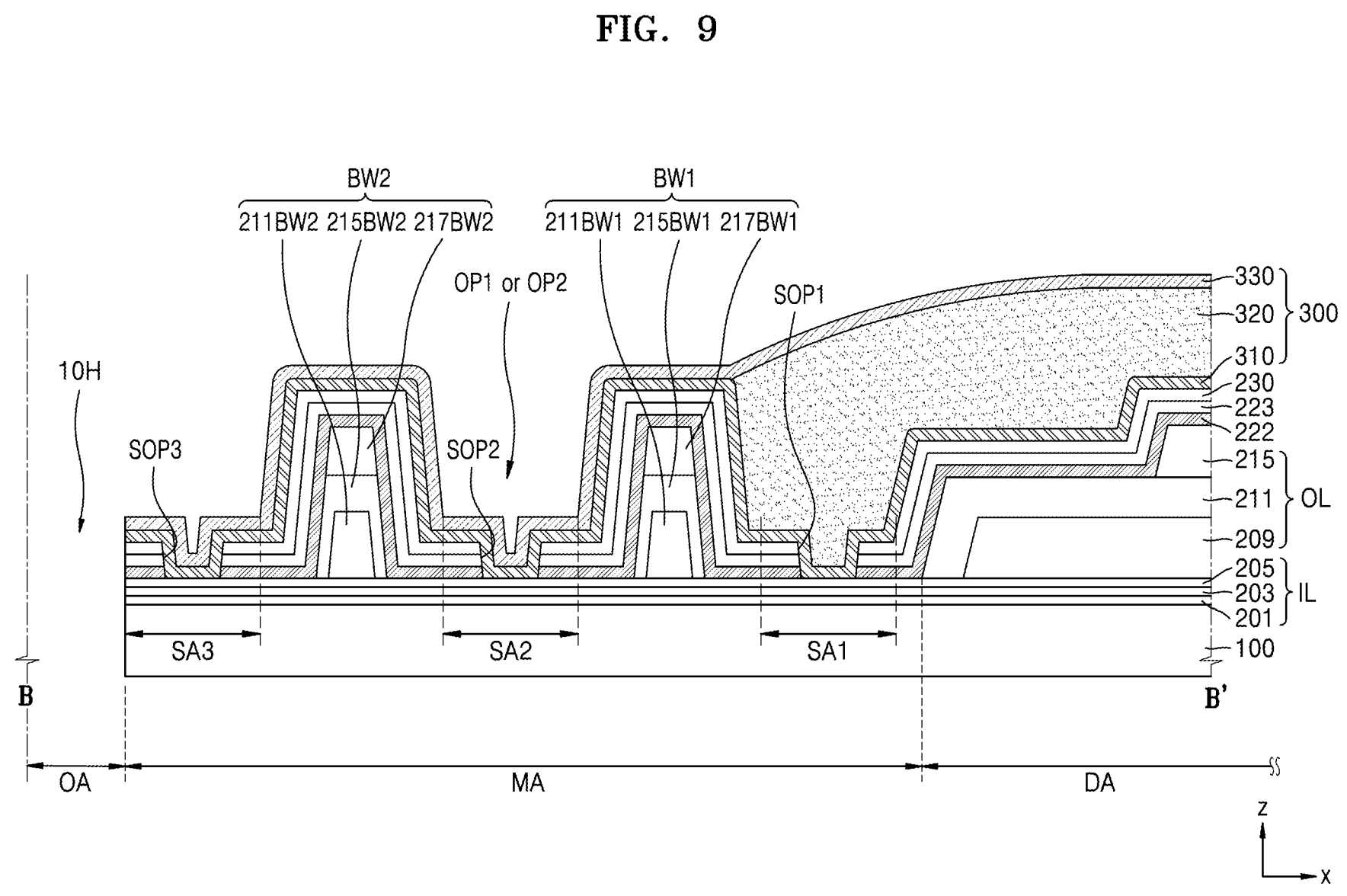

FIG. 9 is a schematic cross-sectional view of an example of the display panel of FIG. 6, taken along line B-B'.

As shown in FIG. 9, the intermediate layer 222, the opposite electrode 223, and the capping layer 230 described above may be disposed on the inorganic insulating layer IL along the middle area MA and the display area DA. At least one opening SOP1, SOP2, and SOP3 formed by a laser process may be defined in the intermediate layer 222, the opposite electrode 223, and the capping layer 230 in the middle area MA.

A sacrificial layer (not shown) may be arranged in at least one of an area SA1 between the first blocking wall BW1 and the display area DA, the area SA2 between the first blocking wall BW1 and the second blocking wall BW2, and an area SA3 between the second blocking wall BW2 and the first opening portion 10H. Alternatively, in some cases, the sacrificial layer (not shown) and the openings SOP1, SOP2, and SOP3 arranged in the sacrificial layer (not shown) may be omitted.

In particular, the sacrificial layer (not shown) may be disposed below at least one of the intermediate layer 222, the opposite electrode 223, and the capping layer 230. Preferably, the sacrificial layer (not shown) may be disposed below the intermediate layer 222. The sacrificial layer (not shown) may then be removed by a laser process.

The sacrificial layer (not shown) may be removed before the first inorganic encapsulation layer 310 is formed. After the sacrificial layer (not shown) is arranged in the opening, the sacrificial layer (not shown) may be removed through a laser process of irradiating a laser to the sacrificial layer (not shown). While the sacrificial layer (not shown) is removed, an area of at least one of the intermediate layer 222, the opposite electrode 223, and the capping layer 230, the area corresponding to the sacrificial layer (not shown), may be removed together with the sacrificial layer (not shown). Preferably, while the sacrificial layer (not shown) is removed by a laser process, an area corresponding to the sacrificial layer (not shown) among the intermediate layer 222, the opposite electrode 223, and the capping layer 230 may be simultaneously removed.

In particular, the area corresponding to the sacrificial layer (not shown) may include areas of the intermediate layer 222, the opposite electrode 223, and the capping layer 230, the areas being overlapping with the sacrificial layer (not shown), when viewed from a direction perpendicular to the substrate 100. As such, areas of the intermediate layer 222, the opposite electrode 223, and the capping layer 230, the areas overlapping the sacrificial layer (not shown) may be easily removed by using the sacrificial layer (not shown).

As a result, the first inorganic encapsulation layer 310 may cover a portion removed together with the sacrificial layer (not shown). That is, the first inorganic encapsulation layer 310 may be in contact with the upper surface of the inorganic insulating layer IL disposed on the substrate 100 by sealing surfaces of the openings SOP1, SOP2, and SOP3 removed by the sacrificial layer (not shown). As such, when the first inorganic encapsulation layer 310 is in contact with the inorganic insulating layer IL, moisture penetration from the opening area OA to the display area DA may be more effectively blocked than when an inorganic layer is in contact with an organic layer or when organic layers are in contact with each other.

At this time, the sacrificial layer (not shown) may include the same material as the gate layer 120, include the same material as the pixel electrode 221, or include a layer including a metal material, such as Mo, Ti, Al, Cu, or the like. However, this is only an example, and a material included in the sacrificial layer (not shown) may be variously changed.

Figure 10:
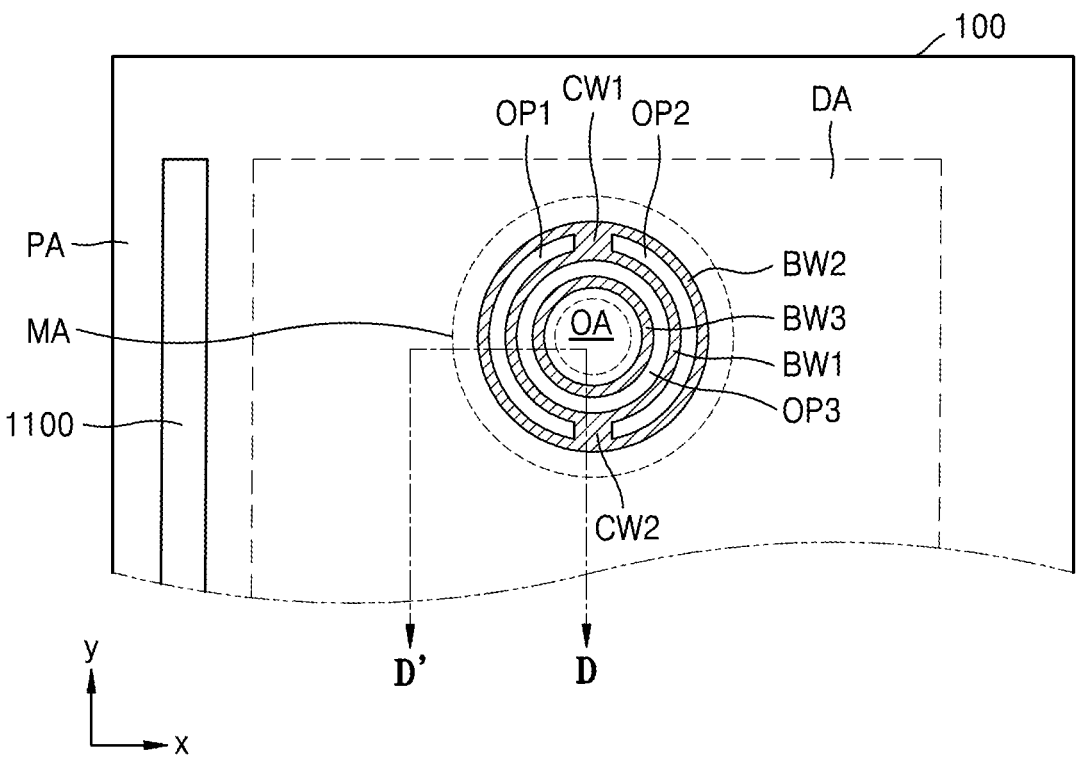
FIG. 10 is a plan view schematically illustrating a vicinity of an opening area in the display panel of FIG. 3.

FIG. 10 is a plan view schematically illustrating a vicinity of the opening area in the display panel of FIG. 3.

As shown in FIG. 10, the display panel 10 according to an embodiment may further include a third blocking wall BW3. The third blocking wall BW3 may be arranged in the middle area MA to surround the opening area OA, and may be disposed on the substrate 100. In particular, the third blocking wall BW3 may be disposed on the inorganic insulating layer IL disposed on the substrate 100. Also, the third blocking wall BW3 may be surrounded by the first blocking wall BW1 described above. That is, the first blocking wall BW1 may be arranged to surround the third blocking wall BW3. When viewed from the vertical direction of the substrate 100, the first blocking wall BW1 may be positioned outside the third blocking wall BW3. The third blocking wall BW3 may have the same layer structure as the first blocking wall BW1 described above, and may include the same material as the first blocking wall BW1.

The third blocking wall BW3 may be configured to prevent an organic material of the organic encapsulation layer 320 from overflowing. To prevent the organic material of the organic encapsulation layer 320 from overflowing, a third opening OP3 may be disposed between the third blocking wall BW3 and the first blocking wall BW1. Also, a distance between the first blocking wall BW1 and the third blocking wall BW3 may be greater than a distance between the first blocking wall BW1 and the second blocking wall BW2.

However, in some cases, it is shown that there is no connection wall between the third blocking wall BW3 and the first blocking wall BW1, but when necessary, an additional connection wall may also be arranged between the third blocking wall BW3 and the first blocking wall BW1.

Figure 11:
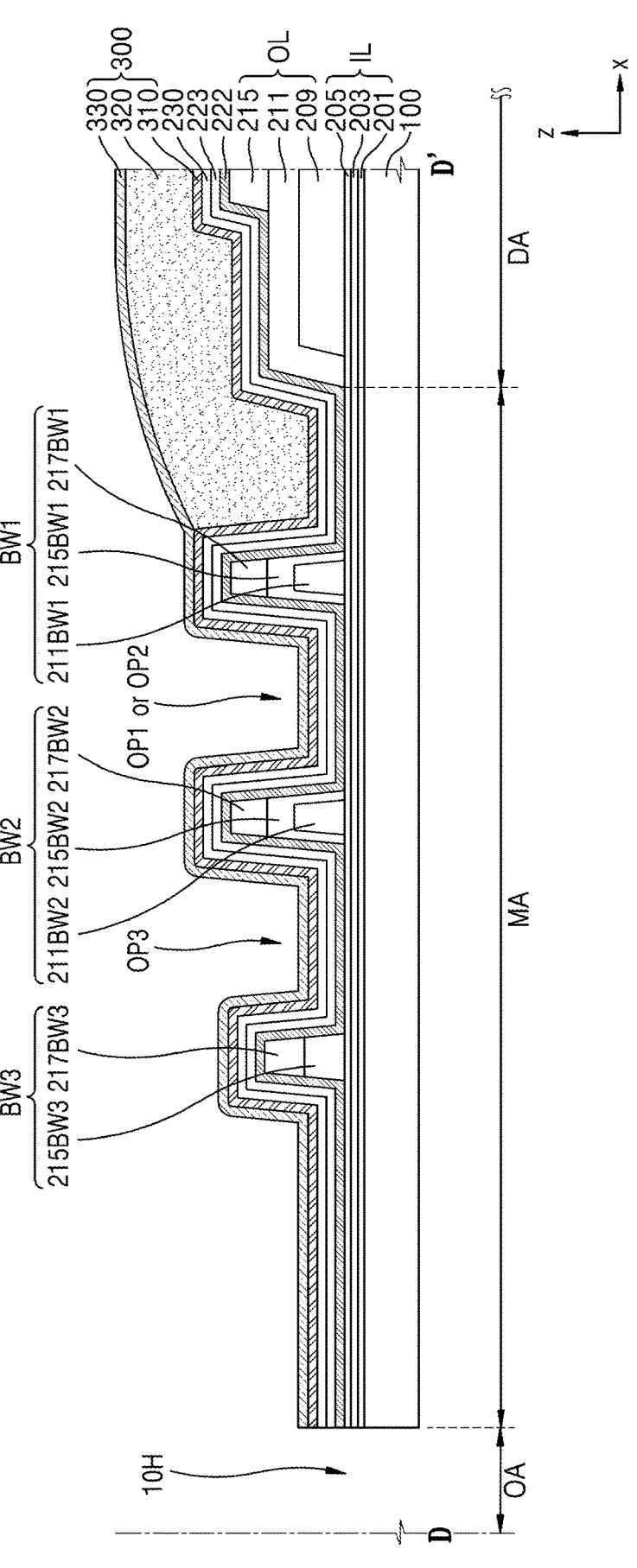
FIG. 11 is a schematic cross-sectional view of an example of the display panel of FIG. 10, taken along line D-D'.

FIG. 11 is a schematic cross-sectional view of an example of the display panel of FIG. 10, taken along line D-D'. In the description of FIG. 11, descriptions already given above may be omitted.

As shown in FIG. 11, the first blocking wall BW1, the second blocking wall BW2, and the third blocking wall BW3 may be arranged in the middle area MA. The third blocking wall BW3 may be spaced apart from the second blocking wall BW2 by a certain interval along the first direction. That is, the second blocking wall BW2 may be disposed between the first blocking wall BW1 and the third blocking wall BW3

In an embodiment, the third blocking wall BW3 may include third-1 and third-2 blocking layers 215BW3 and 217BW3. The third-1 blocking layer 215BW3 of the third blocking wall BW3 may be disposed on the inorganic insulating layer IL and have the same layer structure and the same material as the pixel defining layer 215.

The third-2 blocking layer 217BW3 may be disposed on the third-1 blocking layer 215BW3 and have the same layer structure and the same material as the spacer 217. The first and second inorganic encapsulation layers 310 and 330 may be above the third-1 blocking layer 215BW3 or the third blocking wall BW3.

That is, the first inorganic encapsulation layer 310 and the second inorganic encapsulation layer 330 may extend to the opening area OA and cover the upper surface and side surfaces of the third blocking wall BW3 as well as the first blocking wall BW1 and the second blocking wall BW2.

Figure 12:
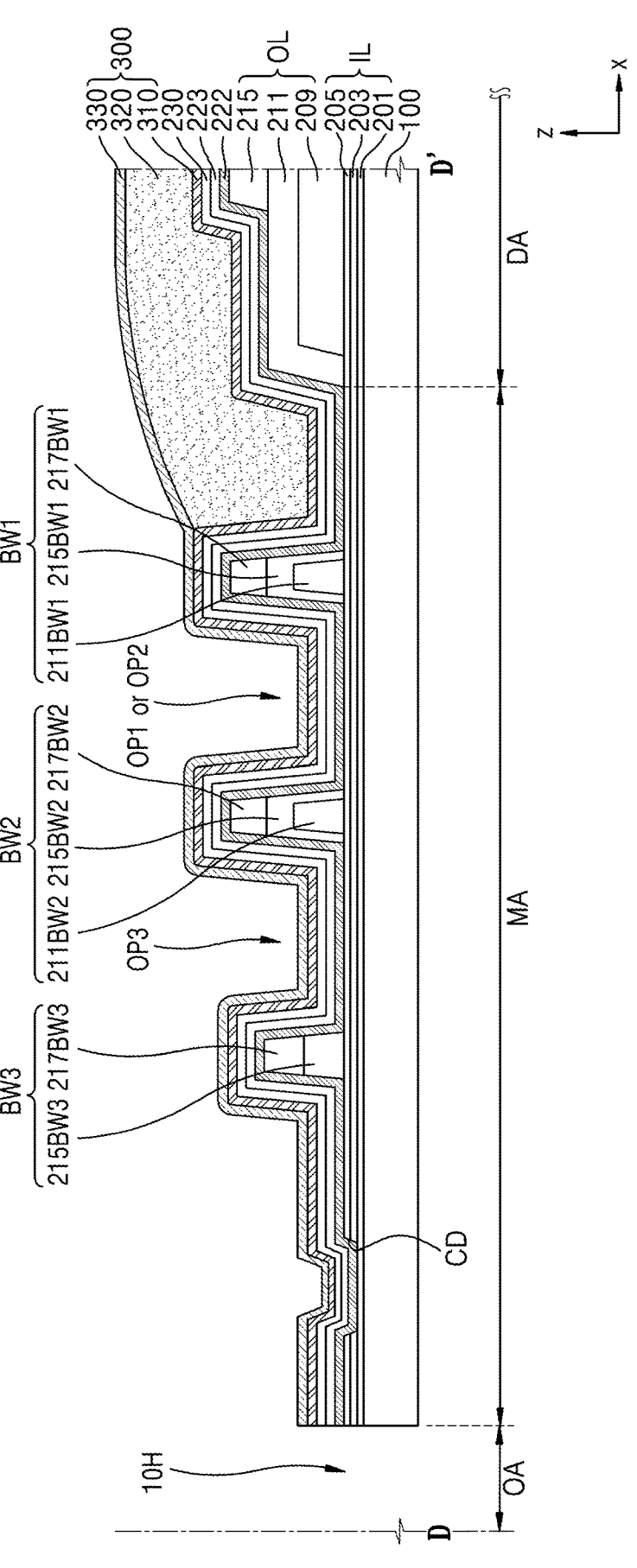
FIG. 12 is a schematic cross-sectional view of an example of the display panel of FIG. 10, taken along line D-D'.
Figure 13:
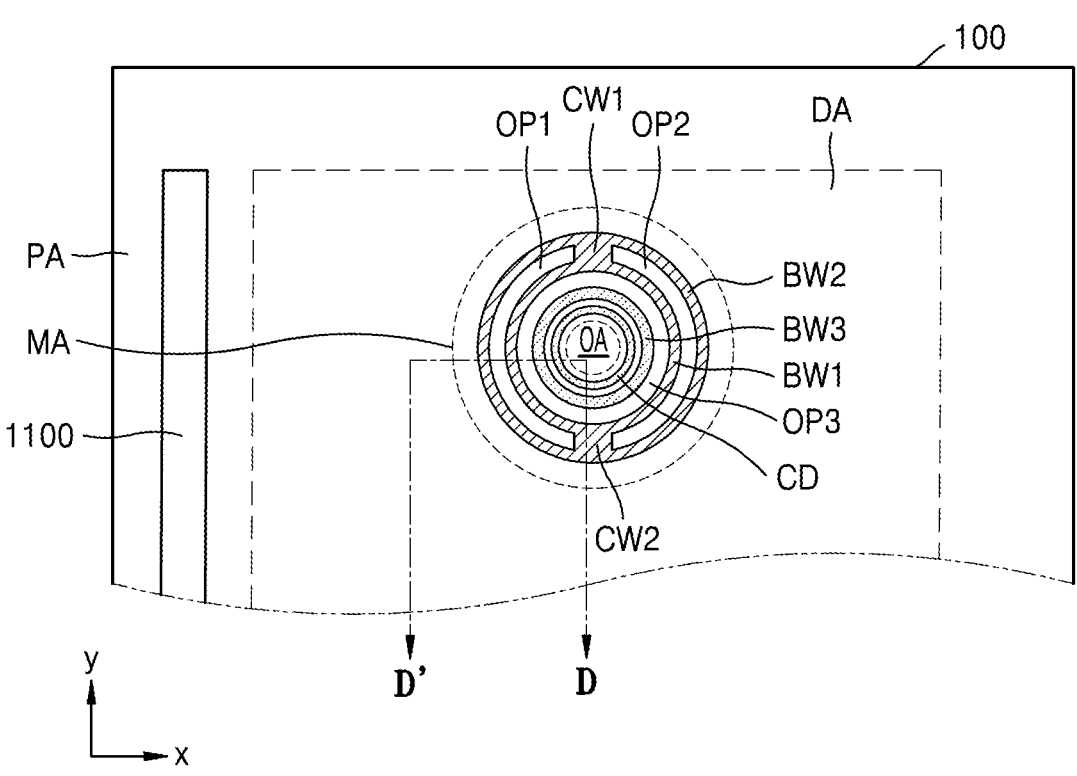
FIG. 13 is a plan view schematically illustrating a vicinity of an opening area in the display panel of FIG. 3.

FIG. 12 is a schematic cross-sectional view of an example of the display panel of FIG. 10, taken along line D-D', and FIG. 13 is a plan view schematically illustrating a vicinity of an opening area in the display panel of FIG. 3. In the descriptions of FIGS. 12 and 13, those already given with reference to FIGS. 7 to 11 may be omitted.

As shown in FIGS. 12 and 13, an additional opening CD between the third blocking wall BW3 and the first opening portion 10H may be defined in the gate insulating film 203 and the interlayer insulating film 205 of the inorganic insulating layer IL.

In other words, at least a portion of the gate insulating film 203 and the interlayer insulating film 205 of the inorganic insulating layer IL may be removed between the third blocking wall BW3 and the first opening portion 10H, and the intermediate layer 222, the opposite electrode 223, and the capping layer 230 may cover the inner side surface and bottom surface of the additional opening CD formed in the gate insulating film 203 and the interlayer insulating film 205.

As a portion of the inorganic insulating layer IL, the portion being positioned around the first opening portion 10H, which is relatively likely to generate cracks, is removed, the additional opening portion CD may prevent cracks around the first opening portion 10H or the opening area OA.

Figure 14:
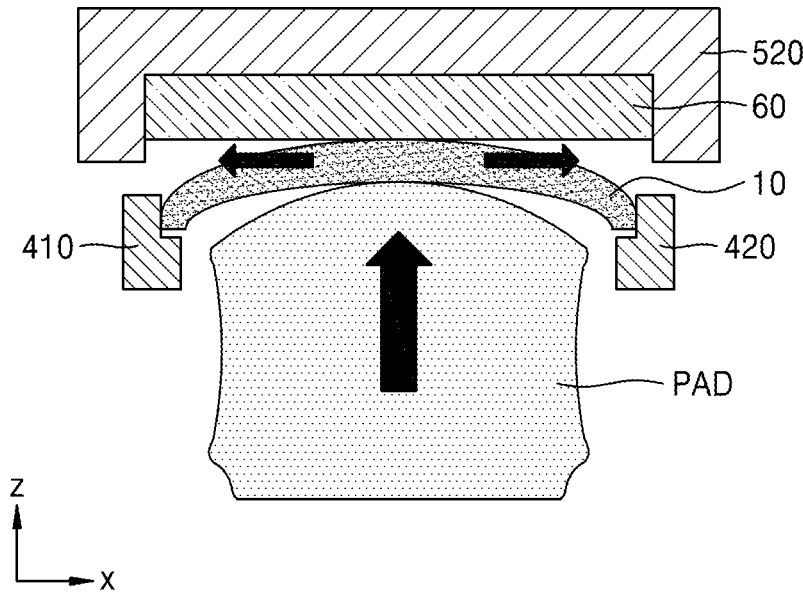
FIG. 14 is a schematic cross-sectional view of a portion of a process of manufacturing a display apparatus by attaching the display panel of FIG. 3 to a cover window by using a pad.
Figure 15:
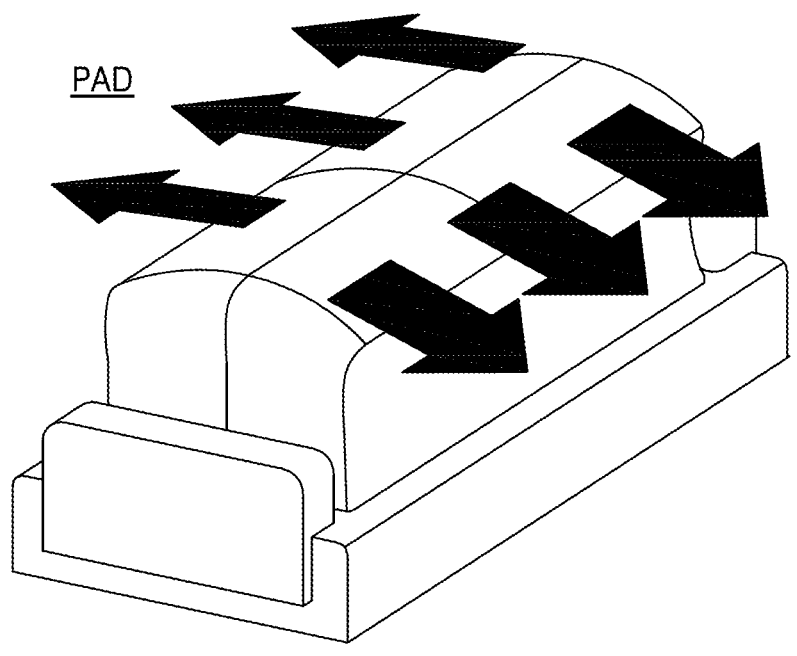
FIG. 15 is a schematic perspective view of the pad used in the process of FIG. 14.
Figure 15:
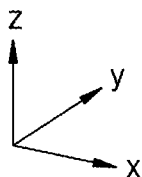

FIG. 14 is a schematic cross-sectional view of a portion of a process of manufacturing a display apparatus by attaching the display panel of FIG. 3 to a cover window by using a pad, and FIG. 15 is a schematic perspective view of the pad used in the process of FIG. 14.

As shown in FIG. 14, the display panel 10 may receive force in a vertical direction by the pad PAD to be adhered to the cover window 60 by the force from the pad PAD. For adhesion, an adhesive film (not shown) may be arranged between the display panel 10 and the cover window 60.

At this time, fixing members 410 and 420 for fixing the display panel 10 may respectively fix both sides of the display panel 10. The cover window 60 to which the display panel 10 is adhered may also be fixed by a fixing member 520. The fixing members 410, 420, and 520 may help the adhesion of the display panel 10 to a more accurate position by fixing the display panel 10 and the cover window 60 not to move.

As shown in FIG. 15, the upper surface of the pad PAD may form a curved surface, and air bubbles may not be generated between the cover window 60 and the display panel 10 during the adhesion process of the display panel 10 due to the shape of the curved surface. That is, the curved surface firstly contacts the center of the display panel 10, and the contact surface between the pad PAD and the display panel 10 may widen from the center to the edge of the display panel 10 according to the shape of the curved surface.

At this time, the upper surface of the pad PAD may be formed to have a curvature in a first direction and extend long in a second direction. Accordingly, because a tensile force applied to the display panel 10 by the pad PAD is applied from the center to the edge of the display panel 10, the tensile force may be transmitted to the display panel 10 in the first direction described above. That is, portions of the first and second blocking walls BW1 and BW2, which exist on a virtual line crossing the center of the display panel 10 in the second direction, may have cracks generated by receiving excessive stress caused by the above tensile force.

Thus, as described above, although the display panel 10 according to FIGS. 3 to 13 includes the first blocking wall BW1 and the second blocking wall BW2, the above problem may be solved by further including the first connection wall CW1 and the second connectional wall CW2 between the first blocking wall BW1 and the second blocking wall BW2.

According to an embodiment as described above, a display panel robust against stress due to a tensile force generated when the display panel is adhered to a cover window may be implemented. The scope of the disclosure is limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display panel comprising:
    a substrate including an opening area, a display area surrounding at least a portion of the opening area, and a middle area disposed between the opening area and the display area, and having a first width in a first direction and a second width in a second direction intersecting with the first direction, wherein the first width is equal to or less than the second width;
    a first blocking wall arranged in the middle area to surround the opening area and including a first upper surface;
    a second blocking wall arranged in the middle area to surround the first blocking wall and including a second upper surface; and
    a first connection wall arranged between the first blocking wall and the second blocking wall and connecting the first blocking wall and the second blocking wall to each other.

2. The display panel of claim 1, further including a second connection wall arranged between the first blocking wall and the second blocking wall, connecting the first blocking wall and the second blocking wall to each other, and spaced apart from the first connection wall.

3. The display panel of claim 2, wherein the first connection wall and the second connection wall are disposed on a virtual straight line passing through a center of the opening area.

4. The display panel of claim 3, wherein the virtual straight line is parallel to the second direction.

5. The display panel of claim 1, wherein the first upper surface, the second upper surface, and an upper surface of the first connection wall form a continuous surface.

6. The display panel of claim 2, wherein the first upper surface, the second upper surface, and an upper surface of the second connection wall form a continuous surface.

7. The display panel of claim 1, wherein a first distance from an upper surface of the substrate to the first upper surface, a second distance from the upper surface of the substrate to the second upper surface, and a third distance from the upper surface of the substrate to an upper surface of the first connection wall are equal to each other.

8. The display panel of claim 2, wherein a first distance from an upper surface of the substrate to the first upper surface, a second distance from the upper surface of the substrate to the second upper surface, a third distance from the upper surface of the substrate to an upper surface of the first connection wall, and a fourth distance between the upper surface of the substrate to an upper surface of the second connection wall are equal to each other.

9. The display panel of claim 1, wherein the opening area is disposed at a center of the substrate in the first direction.

10. The display panel of claim 1, wherein the first blocking wall has a same layer structure as the second blocking wall and includes a same material as the second blocking wall.

11. The display panel of claim 1, wherein the first blocking wall, the second blocking wall, and the first connection wall form an integral body.

12. The display panel of claim 3, wherein the first blocking wall, the second blocking wall, and the second connection wall form an integral body.

13. The display panel of claim 1, further comprising:
    an inorganic insulating layer disposed on the substrate;
    a first organic insulating layer disposed on the inorganic insulating layer; and
    a pixel defining layer disposed on the first organic insulating layer.

14. The display panel of claim 13, wherein at least one of the first blocking wall and the second blocking wall has a same layer structure as the first organic insulating layer and the pixel defining layer, and includes a same material as the first organic insulating layer and the pixel defining layer.

15. The display panel of claim 13, wherein at least one of the first blocking wall and the second blocking wall includes:
    a first sub-blocking wall having a same layer structure as the first organic insulating layer and having a same material as the first organic insulating layer; and
    a second sub-blocking wall disposed on the first sub-blocking wall, having a same layer structure as the pixel defining layer, and having a same material as the pixel defining layer.

16. A display panel comprising:
    a substrate including opening area, a display area surrounding at least a portion of the opening area, and a middle area between the opening area and the display area, and having a first width in a first direction and a second width in a second direction intersecting with the first direction, wherein the first width is equal to or less than the second width;
    an inorganic insulating layer disposed on the substrate; and
    a blocking wall disposed on the inorganic insulating layer, arranged in the middle area to surround the opening area, and including a first opening and a second opening when viewed from a direction perpendicular to the substrate, wherein the first opening exposes a portion of the inorganic insulating layer, and the second opening exposes another portion of the inorganic insulating layer and is positioned to be symmetrical with the first opening with respect to a center of the opening area.

17. The display panel of claim 16, wherein the first opening and the second opening are disposed on a virtual straight line passing through the center of the opening area.

18. The display panel of claim 17, wherein the virtual straight line is parallel to the first direction.

19. The display panel of claim 16, further comprising:

a first organic insulating layer disposed on the inorganic insulating layer; and a pixel defining layer disposed on the first organic insulating layer.

20. The display panel of claim 19, wherein the blocking wall includes a first sub-blocking wall having a same layer structure as the first organic insulating layer and having a same material as the first organic insulating layer; and a second sub-blocking wall disposed on the first sub-blocking wall, having a same layer structure as the pixel defining layer, and having a same material as the pixel defining layer.

\* \* \* \* \*